United States Patent
Maruyama et al.

(10) Patent No.: US 9,818,925 B2
(45) Date of Patent: Nov. 14, 2017

(54) VIBRATING BODY, METHOD OF MANUFACTURING THE SAME AND VIBRATION TYPE DRIVE DEVICE

(71) Applicant: CANON KABUSHIKI KAISHA, Tokyo (JP)

(72) Inventors: Yutaka Maruyama, Tokyo (JP); Masahiro Harada, Osaka (JP); Yosuke Igarashi, Tokyo (JP); Yasuhiro Tsubota, Sakai (JP); Junzaburou Ono, Tokyo (JP); Yasuhiro Ogawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 653 days.

(21) Appl. No.: 13/915,155

(22) Filed: Jun. 11, 2013

(65) Prior Publication Data

US 2013/0334932 A1    Dec. 19, 2013

(30) Foreign Application Priority Data

Jun. 14, 2012 (JP) ................................ 2012-134488

(51) Int. Cl.
    *H01L 41/053*      (2006.01)
    *H01L 41/27*      (2013.01)
    (Continued)

(52) U.S. Cl.
    CPC ........ *H01L 41/053* (2013.01); *H01L 41/0815* (2013.01); *H01L 41/0831* (2013.01);
    (Continued)

(58) Field of Classification Search
    CPC . H01L 41/053; H01L 41/0815; H02N 2/0015; H02N 2/002
    (Continued)

(56) References Cited

U.S. PATENT DOCUMENTS

| 6,051,913 | A | * | 4/2000 | King | .................. H04R 1/00 310/322 |
| 6,897,601 | B2 | * | 5/2005 | Birth | ................ H01L 41/053 310/326 |
| 7,044,587 | B2 | | 5/2006 | Yuu et al. | |
| 7,358,655 | B2 | | 4/2008 | Ragossnig et al. | |
| 9,153,765 | B2 | | 10/2015 | Florian et al. | |

(Continued)

FOREIGN PATENT DOCUMENTS

| JP | 2842448 B2 | 1/1999 |
| JP | 11-128639 A | 5/1999 |

(Continued)

OTHER PUBLICATIONS

Japanese Office Action dated Apr. 25, 2017 in Japanese Patent Application No. 2013-124414.

*Primary Examiner* — Derek Rosenau
(74) *Attorney, Agent, or Firm* — Fitzpatrick, Cella, Harper & Scinto

(57) ABSTRACT

A vibrating body includes a substrate, a piezoelectric element comprising a piezoelectric layer and electrode layers and joined to the substrate, and a ceramic layer between the substrate and the piezoelectric element. The ceramic layer comprises a first region and a second region which is adjacent to the first region in a direction perpendicular to a thickness direction of the ceramic layer. The first region has a square shape, each side of the first region having a length equal to a thickness of the ceramic layer, the second region has a square shape, each side of the second region having the length equal to the thickness of the ceramic layer, and a difference between a porosity of the first region and a porosity of the second region is not greater than 15%.

15 Claims, 6 Drawing Sheets

(51) Int. Cl.
  *H01L 41/083* (2006.01)
  *H01L 41/273* (2013.01)
  *H01L 41/314* (2013.01)
  *H01L 41/319* (2013.01)
  *H02N 2/00* (2006.01)
  *H02N 2/02* (2006.01)
  *H02N 2/10* (2006.01)
  *H01L 41/08* (2006.01)
  *H01L 41/09* (2006.01)

(52) U.S. Cl.
  CPC .......... *H01L 41/0986* (2013.01); *H01L 41/27* (2013.01); *H01L 41/273* (2013.01); *H01L 41/314* (2013.01); *H01L 41/319* (2013.01); *H02N 2/002* (2013.01); *H02N 2/0015* (2013.01); *H02N 2/026* (2013.01); *H02N 2/103* (2013.01)

(58) Field of Classification Search
  USPC .................................... 310/321, 323.02, 348
  See application file for complete search history.

(56) References Cited

U.S. PATENT DOCUMENTS

| | | | |
|---|---|---|---|
| 2011/0025168 A1* | 2/2011 | Maruyama | H01L 41/0906 310/323.06 |
| 2011/0291525 A1* | 12/2011 | Maruyama | H02N 2/0015 310/334 |
| 2012/0153774 A1* | 6/2012 | Maruyama | H01L 27/20 310/323.02 |

FOREIGN PATENT DOCUMENTS

| | | |
|---|---|---|
| JP | 11-322459 A | 11/1999 |
| JP | 2003-069104 A | 3/2003 |
| JP | 2004-142350 A | 5/2004 |
| JP | 2004-304887 A | 10/2004 |
| JP | 2005-327512 A | 11/2005 |
| JP | 2006-024557 A | 1/2006 |
| JP | 2006-518934 A | 8/2006 |
| JP | 2008-546206 A | 12/2008 |
| JP | 2011-045869 A | 3/2011 |
| JP | 2011-217493 A | 10/2011 |

* cited by examiner

VIBRATING BODY, METHOD OF MANUFACTURING THE SAME AND VIBRATION TYPE DRIVE DEVICE

BACKGROUND OF THE INVENTION

Field of the Invention

The present invention relates to a vibrating body, a method of manufacturing the same and a vibration type drive device. More particularly, the present invention relates to a vibrating body including a piezoelectric element rigidly secured onto a substrate, a method of manufacturing the same and a vibration type drive device formed by using such a vibrating body.

Description of the Related Art

Piezoelectric elements have been popularly employed as vibration sources of vibrating bodies (to be also referred to as vibrators) in vibration type drive devices (vibration type actuators).

Piezoelectric elements include single plate piezoelectric elements and multilayered piezoelectric elements formed by laying a large number of piezoelectric layers recently (see Japanese Patent Application Laid-Open No. 2004-304887).

FIG. 8 is a schematic perspective view of a known linear type vibration wave (ultrasonic wave) drive unit 20 disclosed in the above cited Japanese Patent Application Laid-Open No. 2004-304887, representing an external appearance thereof. The illustrated linear vibration type drive device 20 includes a vibrating body 21 and a linear slider 26, which is brought into contact with the vibrating body 21 as pressure is applied to it and is a driven body.

The vibrating body 21 includes a multilayered piezoelectric element 23 and a vibrating plate 22. The multilayered piezoelectric element 23 is formed by alternately laying a plurality of piezoelectric layers and a plurality of electrode layers, while the vibrating plate 22 is made of metal and bonded to the multilayered piezoelectric element 23 by means of an adhesive agent that is made of resin.

The vibrating plate 22 that is made of metal includes a plate section formed to represent a rectangular contour and a pair of projecting sections 24 are formed so as to project from the top surface of the plate section. Contact sections 25 are formed respectively on the front end surfaces of the projecting sections 24. The contact (friction) sections 25 are made to have an abrasion-resistant property because they are members that are brought into direct contact with the linear slider 26 that is a driven body.

The vibrating body 21 of the linear vibration type drive device 20 is made to have a shape with which the resonance frequencies in two flexural vibration modes including the resonance frequency of the second order flexural vibration mode in the long axis direction and the resonance frequency of the first order flexural vibration mode in the short axis direction substantially agree with each other. Then, as two desired high-frequency voltages with phases different by about $\pi/2$ from each other are input, the vibrating body 21 is energized to cause the projecting sections 24 to make a circular motion or an elliptic motion.

The circular or elliptic motion by turn causes the linear slider 26 that is held in contact with the vibrating body 21 under pressure to produce a relative moving force due to the frictional force between the linear slider 26 and the vibrating body 21. Then, the linear slider 26 can linearly reciprocate as indicated by the arrows illustrated in FIG. 8 due to the relative moving force.

Such a multilayered piezoelectric element 23 is manufactured by firstly preparing a predetermined number of green sheets that operate as piezoelectric layers, using powder of a piezoelectric material and an organic binder by the doctor blade method and any others, and forming an electrode layer at a predetermined location on each of the green sheets by putting paste of an electrode material there by printing.

Then, the predetermined number of green sheets are laid flat one on the other and a multilayer structure is formed by applying pressure onto them. Thereafter, the piezoelectric layers and the electrode layers are integrated by means of simultaneous baking. Subsequently, a polarization process is executed and ultimately a finished multilayered piezoelectric element 23 is produced with predetermined dimensions by machining.

Meanwhile, Japanese Patent No. 2,842,448 proposes a piezoelectric/electrostrictive film type actuator having an integrated multilayered structure formed by sequentially laying an electrode material and a piezoelectric material on at least one surface of a substrate so as to form a multilayer structure and heat treating the multilayer structure.

Furthermore, Japanese Patent Application Laid-Open No. 2011-45869 proposes a vibrating body including a vibrating plate and a piezoelectric element having a piezoelectric layer and electrode layers, which is rigidly secured for the purpose of simultaneous baking and integration by interposing a ceramic layer that contains molten glass powder as glass ingredient between the vibrating plate and the piezoelectric element.

SUMMARY OF THE INVENTION

In the vibrating body 21 of a known vibration type drive device described above by referring to FIG. 8, the multilayered piezoelectric element 23 and the vibrating plate (to be referred to as substrate hereinafter) 22 that is made of metal are bonded to each other by means of an adhesive agent that is made of resin. Since the adhesive agent that is made of resin is soft if compared with the piezoelectric element and metal, the vibrations of the vibrating body are attenuated to a great extent due to the adhesive agent and hence the adhesive agent takes a major role in reducing the efficiency of the vibration type drive device.

In particular, as the resin temperature rises, the vibrations of the vibrating body are attenuated to a greater extent to further reduce the efficiency of the vibration type drive device.

Additionally, when such vibration type drive devices are downsized, the thickness and the positional accuracy of the adhesive layer can vary significantly to consequently adversely affect the performance of the small vibration type drive device. Then, such small vibration type drive devices represent a performance that can vary to a large extent from unit to unit.

Furthermore, known methods of manufacturing multilayered piezoelectric elements require a huge capital investment for manufacturing apparatus that are necessary for molding green sheets from piezoelectric material powder, for multilayering press operations and for machining operations. Such a huge capital investment inevitably pushes up the cost of manufacturing multilayered piezoelectric elements.

The above-cited Japanese Patent No. 2,842,448 proposes a solution for the above-identified problems by simultaneously manufacturing a multilayered piezoelectric element and directly securing (binding) the multilayered piezoelectric element to a substrate without using an adhesive layer. However, when a metal substrate is employed, the chemical elements of the metal are diffused into the piezoelectric layers and the electrode layers of the piezoelectric element at the baking temperature for simultaneously baking the piezoelectric elements that include piezoelectric layers and electrode layers and the substrate for integration.

Then, as a result, the piezoelectric layers are forced to represent a chemical composition that cannot provide them with a high piezoelectric activity due to the diffused metal elements.

In the case of using a ceramic substrate that is more heat-resistant than a metal substrate, chemical elements are not diffused unlike the case of using a metal substrate but chemical reactions hardly take place between the substrate and the electrode layer that is made of a precious metal and directly held in contact with the substrate so that the force binding them can be considerably low.

Then, as a result, the piezoelectric element can be peeled off from the ceramic substrate when they are baked and/or when they are subjected to vibrations. The net result will be that the vibrating body cannot output vibration energy on a stable basis.

Furthermore, when a vibrating plate is formed by using a ceramic substrate and a piezoelectric element and the ceramic substrate are baked simultaneously with a ceramic layer interposed between them, the ceramic layer containing molten glass powder as glass ingredient, according to the above-cited Japanese Patent Application Laid-Open No. 2011-45869, the piezoelectric element and the ceramic substrate cannot stably be bound together for the reason that will be described hereinafter.

One aspect of the present invention is related to a vibrating body having a low cost configuration that can, if downsized, suppress vibration attenuation due to downsizing to improve the vibration efficiency of the vibrating body and output vibration energy on a stable basis. Another aspect of the present invention is related to a method of manufacturing such a vibrating body and a vibration type drive device including such a vibrating body.

In an aspect of the present invention, there is provided a vibrating body including a substrate a piezoelectric element comprising a piezoelectric layer and electrode layers and joined to the substrate and a ceramic layer between the substrate and the piezoelectric element, wherein the ceramic layer comprises a first region and a second region which is adjacent to the first region in a direction perpendicular to a thickness direction of the ceramic layer, wherein the first region has a quadrangular prism shape, each side of the first region having a length equal to a thickness of the ceramic layer, wherein the second region has a quadrangular prism shape, each side of the second region having the length equal to the thickness of the ceramic layer, and wherein a difference between a porosity of the first region and a porosity of the second region is not greater than 15%.

In another aspect of the present invention, there is provided a vibration type drive device including a vibrating body according to the present invention that operates as drive power source.

In still another aspect of the present invention, there is provided a method of manufacturing a vibrating body including a step of forming on a substrate a ceramic layer containing glass powder dispersed in the ceramic powder of the ceramic layer at a rate of not less than 0.5 wt % and not more than 10 wt % relative to the weight of the ceramic powder, the glass powder containing silicon oxide, boron oxide and at least one or more than one alkali earth metal oxides, a step of forming a piezoelectric element having a piezoelectric layer and an electrode layer on the ceramic layer and a step of baking the substrate, the ceramic layer and the piezoelectric element simultaneously.

In this specification, the expression of "porous" refers to a state where pores (voids) are not unevenly distributed but evenly distributed to a certain extent at least in a direction in a substance. For example, "the ceramic layer is porous" means that "pores (voids) are substantially evenly distributed in the ceramic layer in a direction perpendicular to the thickness direction of the ceramic layer".

"Pores are evenly distributed in a direction perpendicular to the thickness direction of the ceramic layer" means that, when the ceramic layer is assumed to be divided in a direction perpendicular to the thickness direction of the ceramic layer into quadrangular prisms having the sides of the same length equal to the thickness of the ceramic layer (e.g., cubes, quadrangular prisms having a rhombic bottom), the difference between the porosity of one of the prisms and the porosity of another one of the prisms arranged adjacent to the former prism in the direction perpendicular to the thickness direction of the former prism is not greater than 15%. Preferably, the difference between the porosity of the former prism and the porosity of the latter prism in the ceramic layer is not greater than 10%.

Further features of the present invention will become apparent from the following description of exemplary embodiments with reference to the attached drawings.

BRIEF DESCRIPTION OF THE DRAWINGS

FIGS. 1A and 1B are schematic cross-sectional views and FIG. 1C is a schematic plan view.

FIG. 2A is a schematic illustration of a method of supporting a vibrating body when applying a voltage to the vibrating body and FIG. 2B is a graph illustrating the relationship between the voltage applied to a vibrating body and the vibration velocity of the vibrating body.

FIGS. 5A and 5B are schematic cross-sectional views and FIG. 5C is a schematic plan view.

FIGS. 6A and 6B are schematic cross-sectional views and FIG. 6C is a schematic plan view.

DESCRIPTION OF THE EMBODIMENTS

Embodiments of the present invention will be described by way of the examples described below.

EXAMPLES

Example 1

Now, an exemplar configuration of a vibrating body according to the present invention will be described below as Example 1 by referring to FIGS. 1A through 1C. The vibrating body of this example includes a substrate and a piezoelectric element having a piezoelectric layer and electrode layers and rigidly secured to the substrate so as to vibrate the substrate by the vibration energy of the piezoelectric element and output the vibration energy of the substrate.

Figure 1A:
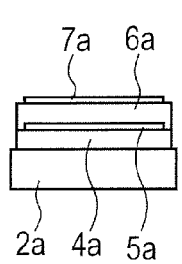
FIGS. 1A, 1B and 1C are schematic illustrations of an exemplar configuration of a vibrating body.
Figure 1B:
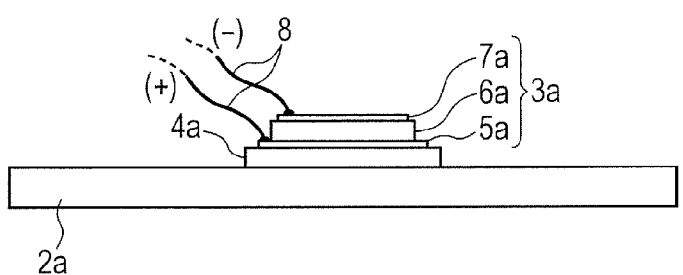
Figure 1C:
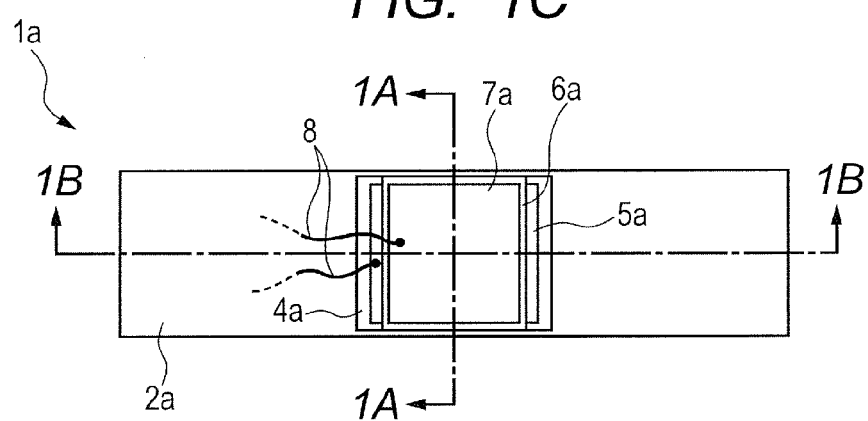

More specifically, the vibrating body of this example is so configured as to give rise to longitudinal vibrations on an assumption that the vibrating body 1a is applied to a vibration type drive device as illustrated in FIGS. 1A through 1C. FIG. 1A is a schematic cross-sectional view of the vibrating body taken along the dotted chain line 1A-1A in FIG. 1C and FIG. 1B is a schematic cross-sectional view of the vibrating body taken along the dotted chain line 1B-1B in FIG. 1C.

The vibrating body 1a has a plate-shaped substrate 2a and a piezoelectric element 3a and a ceramic layer 4a that contains a glass ingredient taken in as molten glass powder is arranged between the substrate 2a and the piezoelectric element 3a.

The piezoelectric element 3a is formed by sequentially laying an electrode layer 5a, a piezoelectric layer 6a and another electrode layer 7a. In other words, the electrode layers 5a and 7a are disposed oppositely with the piezoelectric layer 6a interposed between them.

As will be described in greater detail hereinafter, the electrode layer 5a, the piezoelectric layer 6a and the electrode layer 7a of the vibrating body 1a are baked simultaneously with the substrate 2a to consequently bake the piezoelectric element 3a and rigidly secure the piezoelectric element 3a to the substrate 2a by way of the ceramic layer 4a.

Differently stated, the piezoelectric element 3a that operates as vibration energy generation source and the substrate 2a that is to be forced to vibrate by the vibration energy generated by the piezoelectric element 3a so as to operate as vibrating plate are rigidly secured to each other by way of the ceramic layer 4a and integrated.

Electric conduction from an external power source is realized by rigidly securing two electroconductive wires 8 onto the respective electrode layers 5a and 7a by means of solder and any others.

A high-frequency voltage is supplied from an external power source to the electrode layers 5a and 7a so as to control the vibrations of the piezoelectric element 3a. The piezoelectric layer 6a is forced to expand and contract (to be distorted) by the applied high-frequency voltage and, as a result, the expansions and contractions of the piezoelectric layer 6a are output from the vibrating body 1a that is integrally combined with the substrate 2a to the outside as vibration energy.

The piezoelectric element 3a is located at a central part of the substrate 2a. The substrate 2a has a length of 25 mm, a width of 9 mm and a thickness of 0.3 mm. The thickness of the piezoelectric layer 6a is about 15 μm and both the thickness of the electrode layer 5a and that of the electrode layer 7a are about 5 μm.

The ceramic layer 4a is about 15-μm thick and the ceramic layer 4a is 11-mm long and 8.5-mm wide. The electrode layer 5a is 10-mm long and 8-mm wide and the piezoelectric layer 6a is 9-mm long and 8.5-mm wide, while the electrode layer 7a is 8-mm long and 8-mm wide.

Figure 3:
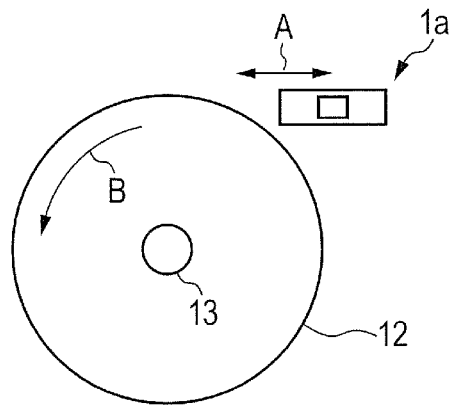
FIG. 3 is a schematic illustration of a vibration type drive device incorporating a vibrating body.

FIG. 3 schematically illustrates the vibration type drive device formed by using the vibrating body 1a of this example. In this example, a disk 12 having a rotational shaft 13 is driven to rotate by means of the vibrating body 1a of this example according to the present invention that operates as drive power source.

Referring to FIG. 3, as the vibrating body 1a is driven to give rise to longitudinal vibrations in the longitudinal directions indicated by arrows A and the vibrating body 1a is so arranged that one of the corners thereof contacts the surface of the disk, the disk 12 can be driven to rotate in the sense indicated by arrow B.

The vibrating body 1a in which the piezoelectric element 3a is integrated with the substrate 2a by way of the ceramic layer 4a can give rise to longitudinal vibrations when a certain high-frequency voltage is applied to the vibrating body.

Figure 2A:
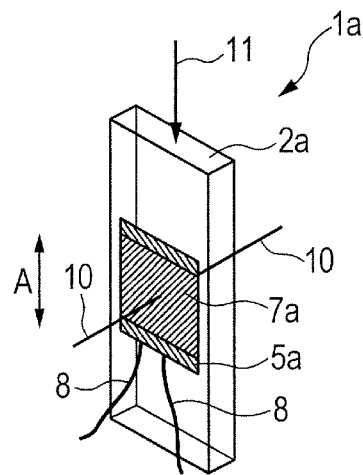
FIGS. 2A and 2B are schematic illustrations of an evaluation test of a vibrating body.

FIG. 2A schematically illustrates a method of measuring the vibration velocity of the vibrating body 1a by means of a laser beam 11 emitted from a laser Doppler meter.

As illustrated in FIG. 2A, the vibrating body 1a is held in position as it is pinched at the center thereof by two contact pins 10. Then, a certain voltage V is applied by way of the two electroconductive wires 8 and the highest vibration velocity v of the vibrating body 1a at the resonance frequency (about 190 KHz) of the longitudinal vibrations of the vibrating body 1a in the directions of arrow A is measured by sweeping the frequency of the applied voltage from a frequency higher than the resonance frequency to a frequency lower than the resonance frequency by means of the laser Doppler meter.

Figure 2B:
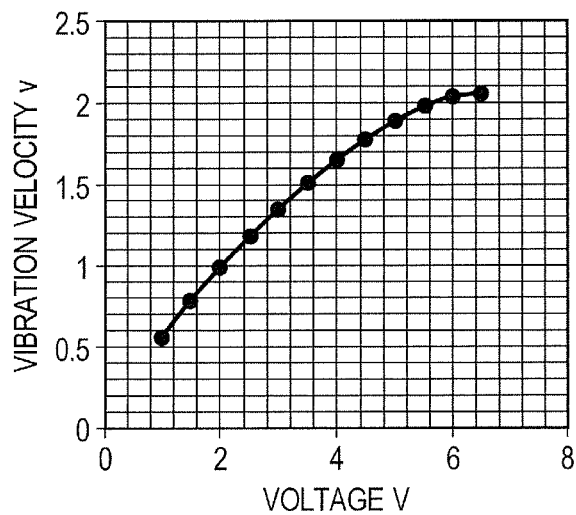

FIG. 2B is a graph illustrating the relationship between the voltage V and the highest vibration velocity v.

As the voltage V is gradually increased from 0.5 V to 6.5 V, the vibration velocity v rises and gets to the highest value of about 2.1 m/s.

However, the vibration velocity does not practically rise any more if the voltage is raised further because the input electric power entails a temperature rise and is turned to heat.

There are instances where a fatigue fracture occurs (to produce cracks) due to the stress generated by vibrations so that consequently the vibrations are attenuated to a large extent to by turn reduce the vibration velocity.

The cracks produced by a fatigue fracture are attributable to the distortion generated by vibrations. Such cracks are apt to be produced along the boundary of the ceramic layer 4a and the electrode layer 5a and also along the boundary of the electrode layer 5a and the piezoelectric layer 6a.

However, when the vibration velocity v is found within a range not higher than about 2.1 m/s, for example when the highest vibration velocity to be used is about 1.5 m/s, no fatigue fracture occurs and the vibrating body 1a remains safe and sound. Then, the vibrations of the vibrating body 1a are not attenuated. On the basis of the above observations, the vibration velocity of a vibrating body cannot satisfactorily be raised when the substrate and the piezoelectric element are bound together defectively in the manufacturing process.

Thus, an evaluation test can be conducted on the vibrating body by measuring the vibration velocity thereof. Such an evaluation test can effectively be used for a manufacturing test.

Since the vibrating body 1a vibrates at a high frequency, a possible fatigue fracture of the vibrating body should inevitably be taken into consideration. In other words, the reliability of vibrating body needs to be evaluated by means of a durability test where the vibrating body is driven to vibrate at a certain vibration velocity for a certain period of time.

Now, a method of manufacturing a vibrating body 1a will be described below.

Firstly, referring to FIGS. 1A through 1C, a plate-shaped ceramic object that has been baked is machined to produce a finished substrate 2a having predetermined dimensions by way of a grinding process and/or a cutting process.

Then, a ceramic powder paste that is prepared by mixing ceramic powder, glass powder which will be described below and an organic vehicle containing an organic solvent and an organic binder so as to be able to produce a thick film is applied onto one of the surfaces of the substrate 2a by screen printing.

Thereafter, the applied ceramic powder paste that is prepared by admixing glass powder is heated at about 150° C. for about 10 minutes to produce a ceramic layer 4a by removing the organic solvent and drying the paste.

Subsequently, electrode layers are formed on the ceramic layer in a manner as described below.

An electroconductive material powder paste prepared by mixing an electroconductive material powder in which piezoelectric powder is admixed in advance and an organic vehicle containing an organic solvent and an organic binder is applied onto the ceramic layer 4a by screen printing and the applied electroconductive material powder paste is heated at about 150° C. for about 10 minutes to produce an electrode layer 5a by drying the paste.

Furthermore, a piezoelectric material powder paste prepared by mixing piezoelectric material powder and an organic vehicle containing an organic solvent and an organic binder so as to be able to produce a thick film is applied onto the surface of the electrode layer 5a by screen printing.

Then, the applied piezoelectric material powder paste is heated at about 150° C. for about 10 minutes to produce a piezoelectric layer 6a by removing the organic solvent and drying the paste.

Thereafter, an electroconductive material powder paste is applied onto the piezoelectric layer 6a by screen printing and the applied electroconductive material powder paste is dried to produce another electrode layer 7a as in the case of producing the electrode layer 5a.

Thus, similar application and drying processes are executed to form a ceramic layer 4a, an electrode layer 5a, a piezoelectric layer 6a and an electrode layer 7a on a substrate 2a.

The ceramic layer 4a and the piezoelectric element 3a, which includes the electrode layer 5a, the piezoelectric layer 6a and the electrode layer 7a that are sequentially laid on the ceramic layer 4a, are still in an unbaked state, on a substrate 2a.

Therefore, after removing the organic binder by heating them in an electric furnace from the room temperature to 500° C., they are baked in a lead atmosphere at the temperature range between 1,100° C. and 1,200° C.

More specifically, the ceramic layer 4a, the electrode layer 5a, the piezoelectric layer 6a, the electrode layer 7a and the substrate 2a are simultaneously baked to produce a finished piezoelectric element and bind (integrate) the piezoelectric element 3a, the ceramic layer 4a and the substrate 2a together at the same time.

Thereafter, electroconductive wires 8 are rigidly fitted to the respective electrode layers 5a and 7a by means of solder and a voltage is applied between the electrode layers 5a and 7a by way of the electroconductive wires 8 to execute a polarization process for the piezoelectric layer 6a.

The conditions of the polarization process are as follows. The electrode layer 5a is grounded (G) and a predetermined voltage of about 45 V (which corresponds to 3 V/μm) is applied between the two electrodes for about 30 minutes for polarization, using the electrode layer 7a as positive (+) electrode, in oil heated to between 120 and 150° C.

The piezoelectric layer 6a is a layer for generating a displacement as a piezoelectrically active layer that has been subjected to a polarization process and the piezoelectric characteristics of this layer are directly related to the vibration characteristics of the vibrating plate and the performance of the vibration type drive device.

As the material of the substrate 2a, alumina (aluminum oxide), a baked ceramic material that is easily available at low cost and attenuates vibrations less than metals (a material that represents an only small energy loss when a vibrating body is formed by using it), is preferable.

The mechanical strength of alumina falls as its purity is degraded. Then, the vibrations generated by a vibrating body formed by using such degraded alumina are attenuated to a large extent. Therefore, the use of high purity alumina whose purity is not less than 99.5 wt % and not more than 99.99 wt % is preferable. Additionally, since alumina is a hard material that is highly abrasion resistant, it can suitably be used for the contact (friction) sections of the vibrating body of a vibration type drive device.

The substrate 2a is preferably made of a material that can stably bind to the ceramic layer 4a in which glass powder is admixed with the ceramic material in advance. Beside alumina, ordinary ceramic materials such as zirconia, silicon carbide, aluminum nitride and silicon nitride can be used for the substrate 2a because the ceramic layer 4a is prepared as admixture by adding glass powder to a ceramic material and hence the glass ingredient in such materials that becomes molten when baked enhances the adhesion strength of ceramic layer 4a to the substrate 2a and the electrode layer 5a to allow them to be tightly bound together.

As the piezoelectric material for forming the piezoelectric layer 6a, three-component system or multi-component system piezoelectric material powder that can be prepared so as to contain lead zirconate and lead titanate ($PbZrO_3$—$PbTiO_3$), which contain lead and have a perovskite type crystal structure, as principal ingredient, to which compounds of a plurality of metal elements are added to a small extent to form a solid solution, is employed. Note that, in this specification, the expression of "principal ingredient" refers to an ingredient contained in the material by no less than 50 mass % or not less than 50 mol %.

Baking temperatures that provide good piezoelectric characteristics are found within the range between 900 and 1200° C.

As electroconductive material powder paste for forming the electrode layers 5a and 7a, an electroconductive material containing silver or palladium or both silver and palladium as principal ingredient, to which powder of a piezoelectric material is added in advance by 15 wt %, is employed.

Since such an electroconductive material powder paste is basically metallic, it can be sintered with ease and then it contracts quickly to a large extent. Therefore, the contraction of the electroconductive material powder due to baking is suppressed by adding piezoelectric powder to the material of the electrode layer 5a to form an admixture so that the electrode layer 5a may not easily be peeled off from the ceramic layer 4a and the piezoelectric layer 6a.

Furthermore, a reaction between the added piezoelectric powder and the ceramic layer can be expected at the same time.

Note, however, that an effect similar to the above-described one can be obtained if the piezoelectric material powder to be added contains ingredients same as the piezoelectric layer 6a or lead zirconate and lead titanate ($PbZrO_3$—$PbTiO_3$) as principal ingredient. The mixing ratio of silver and palladium depends on the baking temperature and the content ratio of palladium in the mixture is adjusted within the range between 0 and 100% according to the baking temperature of the piezoelectric material. The piezoelectric material powder desirably contains silver by about 70 wt % and palladium by about 30 wt % when the baking temperature is between 1,100 and 1,200° C.

In this example, a ceramic powder paste is prepared as ceramic powder for the ceramic layer 4a by adding glass powder to piezoelectric material powder that is same as the piezoelectric material powder of the piezoelectric layer 6a.

As for the chemical composition of the glass powder, the glass powder contains as ingredients thereof silicon oxide desirably within the content ratio range between 20 and 80 mol %, most desirably within the content ratio range between 30 and 70 mol %, boron oxide desirably within the content ratio range between 1 and 40 mol %, most desirably within the content ratio range between 10 and 30 mol % and one or more alkali earth metal oxides within the content ratio range between 1 and 40 mol %, most desirably within the content ratio range between 10 and 30 mol %. A stable glass structure can hardly be obtained when the content ratio of silicon oxide is less than 20 mol % whereas the softening temperature becomes too high to achieve a satisfactory melting effect as sintering additive when the content ratio exceeds 80 mol %. A glass structure that is satisfactory in terms of meltability can hardly be obtained when the content ratio of boron oxide is less than 1 mol % whereas glass flows excessively to make it difficult to obtain a targeted porous body when the content ratio of boron oxide exceeds 40 mol %. The one or more divalent alkali earth metal oxides cannot obtain a satisfactory meltability necessary for achieving the object when the content ratio of the alkali earth metal oxides is less than 1 mol %, whereas a thermally stable glass structure can hardly be obtained when the content ratio of the alkali earth metal oxides exceeds 40 mol %. Additionally, the glass powder can be made to contain metal oxides such as bismuth oxide, aluminum oxide, alkali metal oxides and oxides of other metals as composite ingredients. Glass material powder compounded so as to provide a glass softening temperature that is suited for the baking temperature is admixed with the remaining ingredients.

The mixed glass material powder is molten once and subsequently taken out into the atmosphere for solidification. Then, glass powder (also referred to as glass frit) obtained by crushing the solidified glass material into micro particles having an average particle size between 1 and 2 µm is employed.

The glass powder contained in the ceramic layer 4a is molten and softened to become fluidized in a sintering process. It appears that the molten glass ingredient produced from the glass powder is concentratively accumulated on the interface of the ceramic layer 4a and the substrate 2a and also on the interface of the ceramic layer 4a and the electrode layer 5a so as to allow the ceramic layer 4a to be easily chemically bonded to those layers.

However, in some experiments conducted in the past, there arose a problem that a satisfactory bonding power could not be obtained by using a ceramic layer 4a that contains a glass ingredient and cracks appeared during an integral sintering process and/or during a vibration.

The inventors of the present invention looked into the cause of the problem and the investigation strongly suggested that the mixing/dispersion of the glass frit and the ceramic powder in the ceramic layer 4a had not been satisfactory.

More specifically, if the glass powder and the ceramic powder are not satisfactorily evenly dispersed, the glass ingredient is segregated to unevenly produce large voids in part of the ceramic layer 4a. The net result is that the ceramic layer 4a is peeled off from the substrate.

As a method of satisfactorily and evenly mixing glass frit and ceramic powder, an ordinary printing paste is prepared first and subsequently the mixture is diluted by a solvent such as acetone and disintegrated and dispersed in a ball mill.

Then, the mixture is condensed, while being swung, by means of a rotary evaporator in order to evaporate the diluting solvent, keeping the ingredients in a dispersed state. As a result, the ingredients can be evenly dispersed more satisfactorily.

Figure 4A:
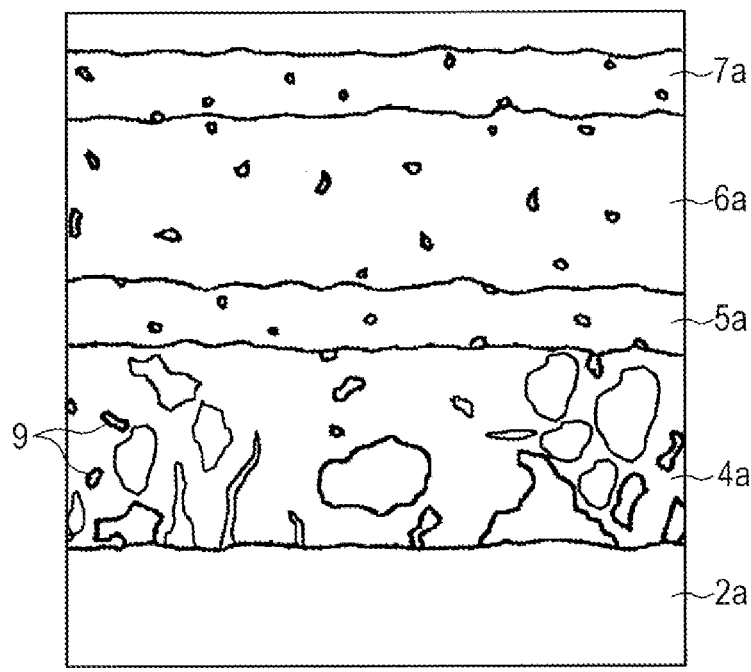
FIG. 4A is a schematic illustration of a ceramic layer sandwiched between a substrate and a piezoelectric element and having cracks therein.
Figure 4B:
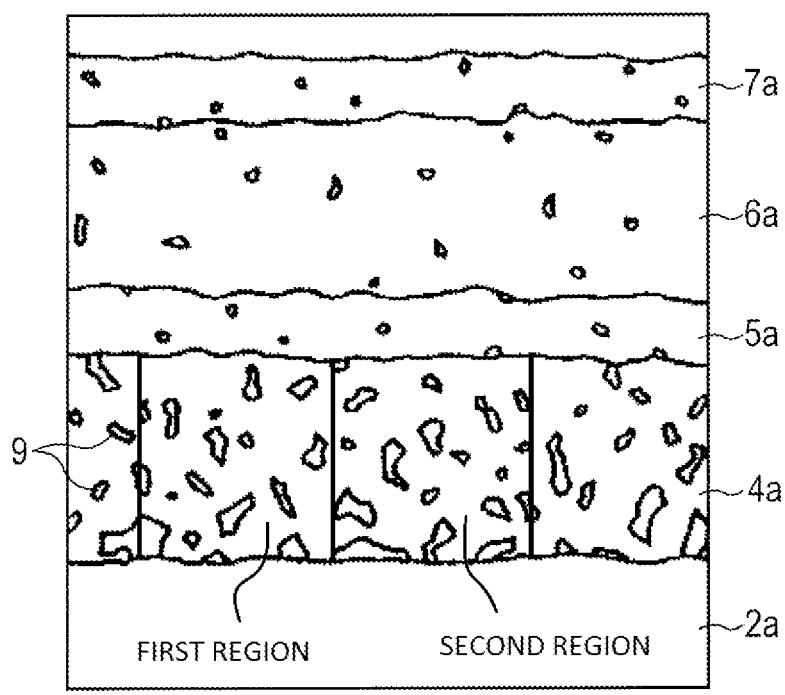
FIG. 4B is a schematic illustration of a ceramic layer that is porous and contains pores (voids) therein, the ceramic layer being sandwiched between a substrate and a piezoelectric element.

FIGS. 4A and 4B schematically illustrates how voids 9 are found in a cross section of the ceramic layer 4a, the electrode layer 5a, the piezoelectric layer 6a and the electrode layer 7a on the substrate 2a that are cut in the thickness direction and polished at the cut surface.

Referring to FIGS. 4A and 4B, the number of voids in the electrode layers 5a and 7a is small because they are made of metal powder and hence sintered well. While voids are found at some grain boundaries including grain triple points but the number of voids is relatively small in the piezoelectric layer 6a.

FIG. 4A illustrates a ceramic layer that contained a glass ingredient but in which cracks appeared during an integral sintering process and/or during a vibration in a past experiment. FIG. 4B illustrates the ceramic layer of this example. In FIG. 4A, cracks appeared during an integral sintering process and/or during a vibration presumably because glass powder and ceramic powder are not evenly dispersed. On the other hand, a ceramic layer 4a that is formed by using a ceramic powder paste in which glass powder is evenly dispersed in ceramic powder evidences that it is a porous layer containing a large number of fine voids 9 as illustrated in FIG. 4B.

While the substrate 2a does not contract during a baking process, the piezoelectric element 3a (including the piezoelectric layer 6a and the electrode layers 5a and 7a) contracts. Therefore, the piezoelectric element 3a comes off from the substrate when the piezoelectric element 3a is formed directly on the substrate.

However, when a ceramic layer 4a in which glass powder and ceramic powder are evenly dispersed is arranged between the substrate 2a and the piezoelectric element 3a in advance, the substrate 2a, the piezoelectric element 3a and the ceramic layer 4a are satisfactorily integrated.

More specifically, the glass powder is molten during a baking process and the ceramic particles in the ceramic layer 4a are easily bound to the substrate 2a and the electrode layer 5a.

Subsequently, while the piezoelectric element 3a that includes the electrode layer 5a, the piezoelectric layer 6a and the electrode layer 7a is contracted progressively, the contraction of ceramic layer 4a is suppressed because the ceramic layer 4a is constrained by the substrate 2a to which the ceramic layer 4a is bonded.

Then, as a result, presumably the proper contraction of the ceramic layer 4a is suppressed and the ceramic layer 4a is distorted in a well-balanced manner between the substrate 2a that does not contract and the piezoelectric element 3a that contracts so that a large number of fine voids 9 are produced in the layer.

As described above, in the present invention, the ceramic layer is porous and pores are substantially evenly distributed in the ceramic layer in a direction perpendicular to the thickness direction of the ceramic layer. The expression that pores are evenly distributed in the ceramic layer in a direction perpendicular to the thickness direction of the ceramic layer means that, when the ceramic layer is divided in a direction perpendicular to the thickness direction of the ceramic layer into quadrangular prisms having the sides of the same length equal to the thickness of the ceramic layer (e.g., cubes, quadrangular prisms having a rhombic bottom), the difference between the porosity of one of the prisms and the porosity of another one of the prisms arranged adjacent to the former prism in a direction perpendicular to the thickness direction of the former prism is not greater than 15%. More specifically, when the ceramic layer is assumed to be divided in a direction perpendicular to the thickness direction of the ceramic layer into quadrangular prisms having the sides of the same length equal to the thickness of the ceramic layer and one of the quadrangular prisms is designated as the first region, while the quadrangular prism arranged adjacent to the first region in a direction perpendicular to the thickness direction of the ceramic layer is designated as the second region, the difference between the porosity of the first region and that of the second region is not greater than 15%.

"A quadrangular prism having the sides of the same length equal to the thickness of the ceramic layer" means that it has sides in three directions including the thickness direction of the ceramic layer, of which the other two directions are perpendicular to the thickness direction, and all the sides have a length equal to the thickness of the ceramic layer. Therefore, "the quadrangular prisms having the sides of the same length equal to the thickness of the ceramic layer" are cubes or quadrangular prisms having a rhombic bottom.

The porosity can be determined by measuring the area of the pores found in a photograph or a schematic illustration of a cross section of the ceramic layer of a vibrating body.

The pores in the ceramic layer are characterized in that the size of each pore is smaller than the film thickness of the ceramic layer and the pores are independent from each other and as a whole evenly distributed in directions perpendicular to the thickness direction of the ceramic layer. The cross sections of large pores more often represent an elliptic contour and the sizes of the pores are not greater than several µm in the direction of the major axis of the elliptic contour.

Thus, the ceramic layer 4a in which a large number of fine voids 9 are evenly distributed in directions perpendicular to the thickness direction of the ceramic layer can suitably be used for binding the substrate 2a and the piezoelectric element 3a and the substrate 2a and the piezoelectric element 3a can be bonded to each other without producing cracks. Then, as a result, the vibrating body 1a can give rise to vibrations that will hardly be attenuated.

As the vibrating body 1a is driven to vibrate, the piezoelectric layer 6a that is a piezoelectrically active layer vibrates, expanding and contracting. The voids 9 in the ceramic layer 4a reduce the Young's modulus of the ceramic layer 4a so that the ceramic layer can operate as buffer for preventing additional cracks from being produced.

A relatively large number of voids 9 are found at the substrate side of the ceramic layer 4a and there is a tendency that the number of voids of the ceramic layer 4a decreases from the substrate toward the electrode layers of the piezoelectric element. In other words, the porosity of the third region in the ceramic layer 4a that is arranged at the substrate side is higher than the fourth region that is arranged at the side of the piezoelectric element relative to the third region.

The porosity of the entire ceramic layer is, for example, within the range between about 10% and about 60%.

Herein, in FIG. 4B, the ceramic layer 4a is divided into squares having the sides of the same length as the thickness of the ceramic layer 4a and the porosity of the squares are determined by following formula.

Porosity of the square (%)=Area of the pores found in the square/Area of the square×100

As a result, in FIG. 4B, the difference between the porosity of one square and the porosity of another one square arranged adjacent to the former is 2.0%. On the other hand, in FIG. 4A, the difference between the porosity of one square and the porosity of another one square arranged adjacent to the former is 28%. In addition, in FIG. 4B, the porosity of the entire ceramic layer 4a is 20%.

When adding glass powder, small beads or micro beads (to be also referred to as pore forming members) are also added and evenly dispersed in the ceramic powder paste. In the baking process, the beads are burnt, lost and hence removed to produce voids 9 in the ceramic layer 4a, which advantageously affect the subsequent bonding operation.

When the ratio by weight of the glass powder relative to the ceramic powder is less than 0.5 wt %, the ceramic layer is not satisfactorily bonded to the substrate. When, on the other hand, the ratio by weight of the glass powder relative to the ceramic powder exceeds 10 wt %, the molten glass powder, or the molten glass ingredient, is disadvantageously diffused into the substrate to a large extent to consequently degrade the mechanical characteristics of the substrate.

Additionally, they also degrade the mechanical properties of the ceramic layer itself. Therefore, glass powder is added to the ceramic powder by not less than 0.5 wt % and not more than 10 wt % of the weight of the ceramic powder.

Any ceramic powder can be used for the ceramic layer provided that the ceramic powder is sintered at the baking temperature of the piezoelectric element and the ceramic layer is made to represent a mechanical strength that is effective for binding the piezoelectric element to the substrate.

For example, ceramic powder that is same as the material of the substrate (alumina powder in this example) can preferably be employed because then the substrate and the ceramic layer have an affinity for each other.

If the piezoelectric material powder to be used for the piezoelectric material is other than the above-described piezoelectric material powder containing lead zirconate and lead titanate and the piezoelectric layer is formed by means of a non-lead type piezoelectric material such as a barium titanate-based material or a bismuth sodium titanate-based material, both of which are piezoelectric materials, the use of powder containing a barium titanate-based material or a bismuth sodium titanate-based material, whichever appropriate, for the ceramic layer is effective.

The advantages of using glass powder include that the chemical composition of the glass powder can easily be adjusted so as to make it suitable for use in terms of baking temperature and mechanical strength and such glass powder can be made compatible with various substrates and various ceramic materials.

Example 2

Figure 5A:
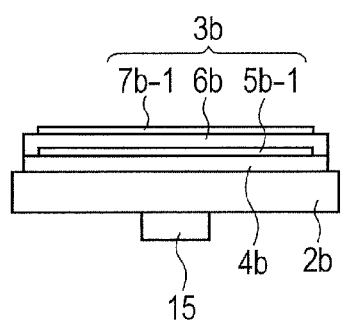
FIGS. 5A, 5B and 5C are schematic illustrations of another exemplar configuration of a vibrating body.
Figure 5B:
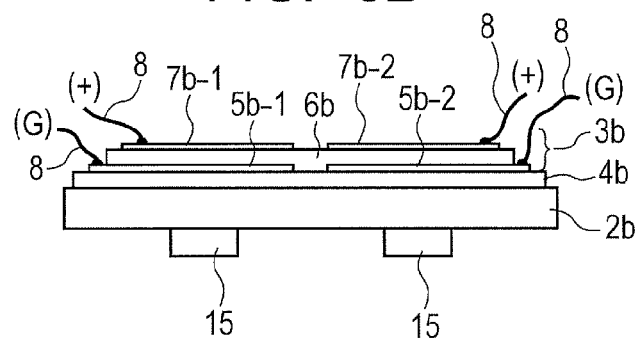
Figure 5C:
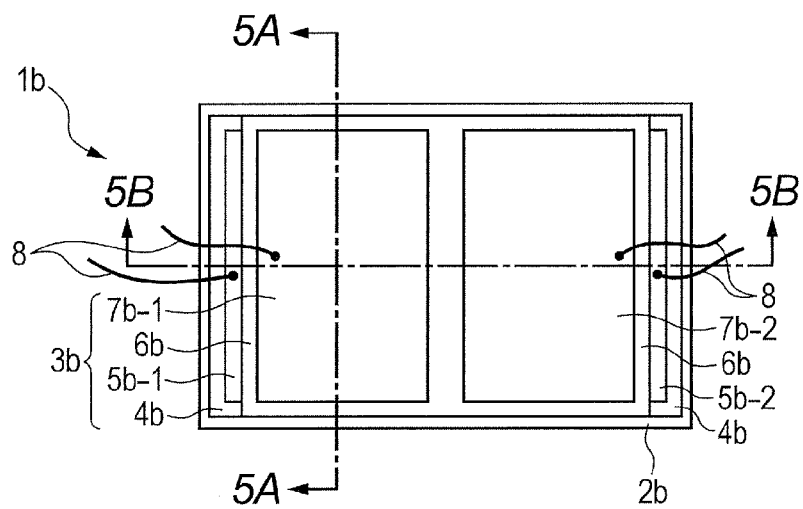

Now, an exemplar configuration of a vibrating body according to the present invention that is different from the configuration of Example 1 will be described below as Example 2 by referring to FIGS. 5A through 5C. FIG. 5A is a schematic cross-sectional view of the vibrating body taken along the dotted chain line 5A-5A in FIG. 5C, and FIG. 5B is a schematic cross-sectional view of the vibrating body taken along the dotted chain line 5B-5B in FIG. 5C. FIG. 5C is a schematic plan view of the vibrating body.

The vibrating body 1b illustrated in FIGS. 5A through 5C is prepared on an assumption that it is to be applied to a vibrating type drive unit for linear drive operations as described earlier as prior art drive unit.

Note that the method of manufacturing such a vibrating body is basically same as the one described above for Example 1. The substrate, the piezoelectric layer, the electrode layers and the ceramic layer of the vibrating body are also basically same as their counterparts of the exemplary vibrating body described above for Example 1.

The vibrating body 1b includes a plate-shaped substrate 2b and a piezoelectric element 3b and a ceramic layer 4b that contains ceramics as glass powder is arranged between the substrate 2b and the piezoelectric element 3b.

The ceramic layer 4b is a porous layer containing a large number of fine voids 9. The substrate 2b and the piezoelectric element 3b are rigidly secured to each other by way of the ceramic layer 4b interposed between them and integrated as a result of simultaneous baking as will be described in greater detail hereinafter.

Differently stated, the piezoelectric element 3b that operates as vibration energy generation source and the substrate 2b that operates as vibrating plate to be forced to vibrate by the vibration energy generated by the piezoelectric element 3a are rigidly secured to each other by way of the ceramic layer 4b interposed between them and integrated to operate as the vibrating body 1b.

In the piezoelectric layer 3b, electrode layers 5b-1 and 5b-2, a piezoelectric layer 6b and electrode layers 7b-1 and 7b-2 are sequentially laid to form a multilayered structure.

The electrode layer arranged on the ceramic layer 4b is divided into two electrode layers 5b-1 and 5b-2 and insulated from each other.

Similarly, the electrode layer arranged on the piezoelectric layer 6b is divided into two electrode layers 7b-1 and 7b-2 and insulated from each other.

The two electrode layers 5b-1 and 5b-2 and the two electrode layers 7b-1 and 7b-2 that are produced by the divisions by two are respectively oppositely disposed with the piezoelectric layer 6b interposed between them.

Electric conduction from an external power source is realized and a polarization process is executed by rigidly securing electroconductive wires 8 onto the respective surfaces of the electrode layers 5b-1, 5b-2, 7b-1 and 7b-2 by means of solder and any others.

Subsequently, the electrode layers 5b-1 and 5b-2 are grounded (G) and a voltage is applied between the two pairs of electrodes, using the electrode layers 7b-1 and 7b-2 as positive electrodes (+), by way of the respective pairs of electroconductive wires 8 to execute a polarization process for the regions of the piezoelectric layer 6b where the electrode layers are oppositely disposed. The conditions of the polarization process are as follows. A predetermined voltage of about 45 V (which corresponds to 3 V/µm) is applied between the ground (G) and the positive electrode (+) of each of the electrode pairs for about 30 minutes for polarization in oil at temperature between 120 and 150° C. The regions that are subjected to a polarization process are those of the layer that produces displacements as piezoelectrically active section so that the piezoelectric characteristics of this layer are directly related to the vibration characteristics of the vibrating plate and the performance of the vibration type drive device.

The substrate 2b has a length of 9 mm, a width of 6 mm and a thickness of 0.3 mm. A pair of 0.2-mm high projecting sections 15 is formed on the surface of the substrate 2b opposite to the surface on which the piezoelectric element 3b is arranged.

The piezoelectric layer 6b of the piezoelectric element 3b has a thickness of about 15 µm and each of the electrode layers 5b-1, 5b-2, 7b-1 and 7b-2 has a thickness of about 5 µm.

The thickness of the ceramic layer 4b is about 15 µm. The projecting sections 15 can be formed by scraping off other than the projecting sections 15 from the rear surface of the alumina substrate 2b by means of blast machining.

Two high-frequency voltages with differentiated phases are applied respectively between the electrode layers 5b-1 and 7b-1 and between the electrode layers 5b-2 and 7b-2 that are produced by the divisions by two from an external power source to control the vibrations of the piezoelectric element 3b.

The piezoelectrically active region of the piezoelectric layer 6b where the electrode layers 5b-1 and 7b-1 and the electrode layers 5b-2 and 7b-2 that are produced by the divisions by two are oppositely disposed is forced to expand and contract and the expansions and contractions of the piezoelectrically active region are transmitted to the substrate 2b by way of the ceramic layer 4b so that the vibrating body 1b vibrates as a whole.

Figure 7:
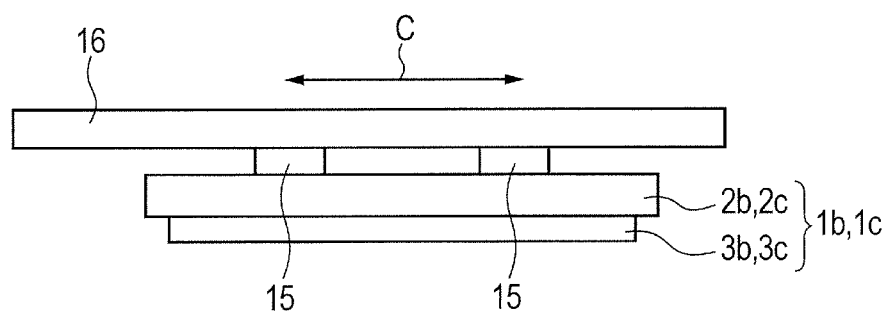
FIG. 7 is a schematic illustration of a linear vibration type drive device incorporating a vibrating body.
Figure 8:
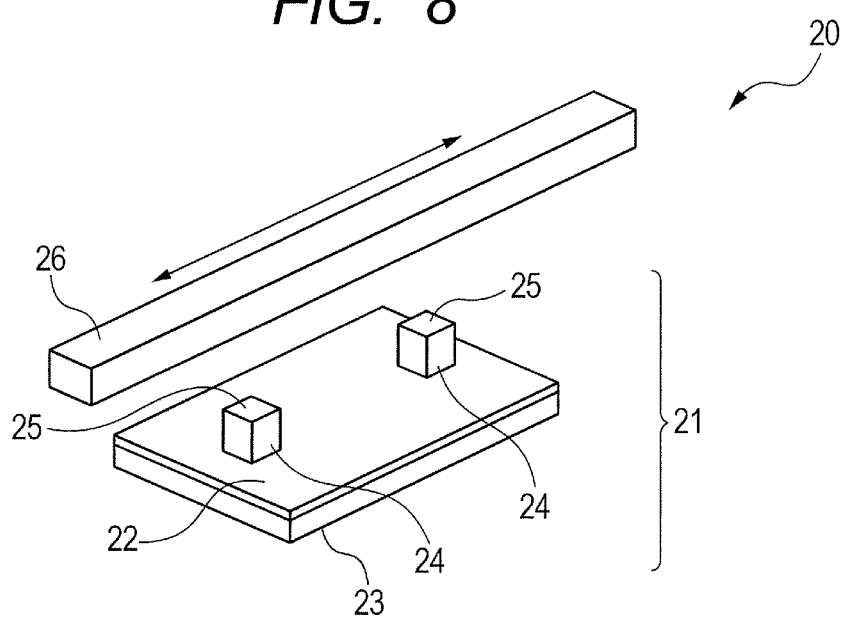
FIG. 8 is a schematic illustration of a linear vibration type drive device.

FIG. 7 is a schematic illustration of a linear vibration type drive device formed by incorporating the vibrating body 1b of Example 2. Note that the principle underlying the linear drive operations of the linear vibration type drive device is same as that of known linear vibration type drive devices.

The linear slider 16 is brought into contact with the projecting sections 15 as pressure is applied to it. Then, the vibrating body 1b is forced to vibrate by the vibrations of the piezoelectric element 3b and the linear slider 16 linearly reciprocates as indicated by the arrow C in FIG. 7 due to the elliptic motion generated by the projecting sections 15. The projecting sections 15 are made of alumina just like the vibrating body 1b and hence abrasion-resistant.

Example 3

Figure 6A:
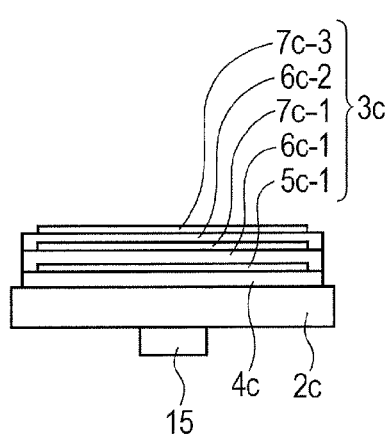
FIGS. 6A, 6B and 6C are schematic illustrations of still another exemplar configuration of a vibrating body.
Figure 6B:
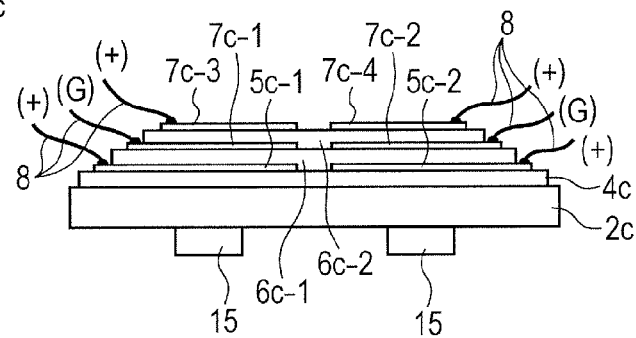
Figure 6C:
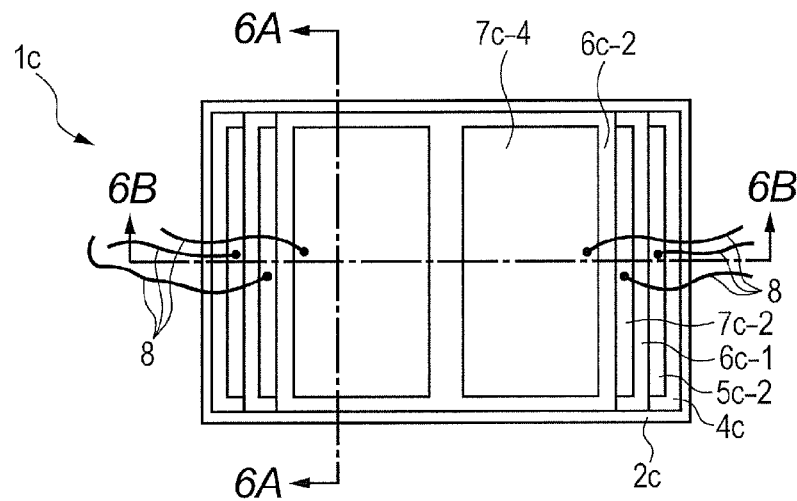

Now, an exemplar configuration of a vibrating body according to the present invention that is different from the configuration of Example 1 and that of the configuration of Example 2 will be described below as Example 3 by referring to FIGS. 6A through 6C. FIG. 6A is a schematic cross-sectional view of the vibrating body taken along the dotted chain line 6A-6A in FIG. 6C, and FIG. 6B is a schematic cross-sectional view of the vibrating body taken along the dotted chain line 6B-6B in FIG. 6C. FIG. 6C is a schematic plan view of the vibrating body.

The vibrating body 1c of this example is formed by sequentially laying the layers as described below on a plate-shaped substrate 2c as illustrated in FIGS. 6A through 6C.

Namely, a multilayered type piezoelectric element 3c formed by sequentially laying electrode layers 5c-1 and 5c-2, a piezoelectric layer 6c-1, electrode layers 7c-1 and 7c-2, a piezoelectric layer 6c-2 and electrode layers 7c-3 and 7c-4 is disposed on the plate-shaped substrate 2c by way of a ceramic layer 4c. The ceramic layer 4c contains a large number of fine voids 9 in it and hence is porous.

The electrode layers 5c-1 and 5c-2 are formed by dividing a single electric layer into two and insulated from each other. Similarly, the electrode layers 7c-1 and 7c-2 and the electrode layers 7c-3 and 7c-4 are formed by dividing respective single electrode layers into two and insulated from each other.

The electrode layers 5c-1 and 5c-2 and the electrode layers 7c-1 and 7c-2 that are produced by the divisions by two are respectively oppositely disposed with a piezoelectric layer 6c-1 interposed between them.

Similarly, the electrode layers 7c-1 and 7c-2 and the electrode layers 7c-3 and 7c-4 that are produced by the divisions by two are respectively oppositely disposed with a piezoelectric layer 6c-2 interposed between them.

While the vibrating body of Example 2 has a single piezoelectric layer 6b, the vibrating body of Example 3 has two piezoelectric layers 6c-1 and 6c-2.

In other words, the piezoelectric element of the vibrating body of this example is a multilayered piezoelectric element formed by adding a piezoelectric layer and an electrode layer to the piezoelectric element of the vibrating body of Example 2. Otherwise, the vibrating body of this example is basically same as the vibrating body of Example 2.

The two piezoelectric layers of Example 3 can be operated with a lower voltage to produce greater displacements (distortions) than the piezoelectric element of Example 2 which has one piezoelectric layer. The number of piezoelectric layers can be increased to three or more so that they may be driven to operate with a still lower voltage.

In the vibrating body 1c of this example, the substrate has a length of 12 mm, a width of 5 mm and a thickness of 0.3 mm. Each of the piezoelectric layers 6c-1 and 6c-2 has a thickness of about 15 μm. Each of the electrode layers 5c-1, 5c-2, 7c-1, 7c-2, 7c-3 and 7c-4 has a thickness of about 5 μm.

Note that the method of manufacturing such a vibrating body is basically same as the one described above for Example 1. The substrate, the piezoelectric layers, the electrode layers and the ceramic layer of the vibrating body are also basically same as their counterparts described above for Example 1.

Electric conduction from an external power source is realized and a polarization process is executed by rigidly securing electroconductive wires 8 onto the respective surfaces of the six electrode layers 5c-1, 5c-2, 7c-1, 7c-2, 7c-3 and 7c-4 produced by the divisions by two by means of solder and any others.

Thereafter, basically as in Example 1, the electrode layers 7c-1 and 7c-2 are grounded (G) and a predetermined voltage of about 45 V (which corresponds to 3 V/μm) is applied between the electrode layers 5c-1 and 7c-1, between the electrode layers 7c-1 and 7c-3, between the electrode layers 5c-2 and 7c-2 and between the electrode layers 7c-2 and 7c-4, using the electrode layers 5c-1, 7c-3, 5c-2 and 7c-4 positive electrodes (+), by way of the respective electroconductive wires 8 to execute a polarization process for about 30 minutes in oil heated to between 120 and 150° C.

The region sandwiched between the electrode layers of the piezoelectric layer 6c-1 and the piezoelectric layer 6c-2 that has been subjected to a polarization process is a layer for generating a displacement as piezoelectrically active section, and the piezoelectric characteristics of this layer are directly related to the vibration characteristics of the vibrating plate and the performance of the vibration type drive device.

The substrate 2c has a length of 9 mm, a width of 6 mm and a thickness of 0.3 mm. A pair of 0.2-mm high projecting sections 15 is formed on the surface of the substrate 2c opposite to the surface on which the piezoelectric element 3c is arranged.

Each of the piezoelectric layers 6c-1 and 6c-2 of the piezoelectric element 3c has a thickness of about 15 μm and each of the electrode layers 5c-1, 5c-2, 7c-1, 7c-2, 7c-3 and 7c-4 has a thickness of about 5 μm.

The thickness of the ceramic layer 4c is about 15 μm. The pair of projecting sections 15 is arranged on the substrate 2c. The projecting sections 15 can be formed by scraping off other than the projecting sections 15 from the rear surface of the alumina substrate 2c by means of blast machining.

Two high-frequency voltages with differentiated phases are applied respectively between the electrode layers 5c-1 and 7c-1, between the electrode layers 7c-1 and 7c-3, between the electrode layers 5c-2 and 7c-2, between the electrode layers 7c-2 and 7c-4 from an external power source to control the vibrations of the piezoelectric element 3c. The piezoelectrically active regions of the piezoelectric layers 6c-1 and 6c-2 where the electrode layers 5c-1, 7c-1 and 7c-3 and the electrode layers 5c-2, 7c-2 and 7c-4 are oppositely disposed are forced to expand and contract (to be distorted) and the expansions and contractions of the piezoelectrically active regions are transmitted to the substrate 2c by way of the ceramic layer 4c so that the vibrating body 1c vibrates as a whole.

FIG. 7 schematically illustrates the configuration of a linear vibration type drive device in which the vibrating body 1c of Example 3 is incorporated.

Note that the principle underlying the linear drive operations of the linear vibration type drive device is same as that of known linear vibration type drive devices.

The linear slider 16 is brought into contact with the projecting sections 15 as pressure is applied to it. Then, the vibrating body 1c is forced to vibrate by the vibrations of the piezoelectric element 3c, and the linear slider 16 reciprocates due to the elliptic motion generated by the projecting sections 15.

While the electroconductive wires 8 are used to electrically connect the electrode layers to an external power source in each of the above-described examples, the electroconductive wires 8 of each example may be replaced by a flexible circuit substrate and the electrode layers may be electrically connected to an external power source by means of an electroconductive material powder paste.

A multilayer structure having thin and accurately dimensioned layers can be formed more easily by means of a screen printing technique than by means of green sheets. Furthermore, materials can be applied at desired positions highly accurately in a well-controlled manner and no machining is required after a sintering operation.

Additionally, the facility for manufacturing such multilayer structures can be built at low cost and hence the cost of manufacturing a piezoelectric element according to the present invention can be reduced to a large extent from the cost of manufacturing any comparable known piezoelectric element.

The present invention provides a vibrating body having a low cost configuration that can, if downsized, suppress vibrations attenuation due to downsizing to improve the vibration efficiency of the vibrating body and output vibration energy on a stable basis. The present invention also provides a method of manufacturing such a vibrating body and a vibration type drive device including such a vibrating body.

While the present invention has been described with reference to exemplary embodiments, it is to be understood that the invention is not limited to the disclosed exemplary embodiments. The scope of the following claims is to be accorded the broadest interpretations so as to encompass all such modifications and equivalent structures and functions.

This application claims the benefit of Japanese Patent Application No. 2012-134488, filed Jun. 14, 2012, which is hereby incorporated by reference herein in its entirety.

What is claimed is:

1. A vibrating body comprising:
a substrate;
a piezoelectric element comprising a piezoelectric layer and electrode layers and joined to the substrate; and
a ceramic layer between the substrate and the piezoelectric element,
wherein the ceramic layer comprises a first region and a second region which is adjacent to the first region in a direction perpendicular to a thickness direction of the ceramic layer,
wherein the first region has a square shape, each side of the first region having a length equal to a thickness of the ceramic layer,
wherein the second region has a square shape, each side of the second region having a length equal to the thickness of the ceramic layer,
wherein a difference between a porosity of the first region and a porosity of the second region is not greater than 15%,
wherein a porosity of the entire ceramic layer is between 10 and 60%, and
wherein the porosity of the entire ceramic layer is higher than a porosity of the entire piezoelectric layer.

2. The vibrating body according to claim 1, wherein the ceramic layer is an admixture of glass powder containing a glass ingredient that has been molten once.

3. The vibrating body according to claim 1, wherein the ceramic layer contains an ingredient same as an ingredient of the piezoelectric layer as principal ingredients.

4. The vibrating body according to claim 1, wherein the piezoelectric layer contains lead zirconate and lead titanate as principal ingredients.

5. The vibrating body according to claim 1, wherein the piezoelectric element is formed by baking the piezoelectric layer and the electrode layers containing silver, silver and palladium, or palladium, simultaneously.

6. The vibrating body according to claim 1, wherein the electrode layers of the piezoelectric element contain, in silver, silver and palladium, or palladium, powder of an ingredient same as a principal ingredient of the piezoelectric layer.

7. The vibrating body according to claim 1, wherein the substrate is made of alumina representing a purity of not less than 99.5 wt % and not more than 99.99 wt %.

8. The vibrating body according to claim 1, wherein the piezoelectric element is rigidly secured to the substrate by way of the ceramic layer.

9. A vibration type drive device comprising:
a vibrating body according to claim 1 as a drive power source.

10. A vibrating body comprising:
a substrate;
a piezoelectric element comprising a piezoelectric layer and electrode layers and joined to the substrate; and
a ceramic layer between the substrate and the piezoelectric element,
wherein the ceramic layer comprises a first region and a second region which is adjacent to the first region in a direction perpendicular to a thickness direction of the ceramic layer,
wherein the first region has a square shape, each side of the first region having a length equal to a thickness of the ceramic layer,
wherein the second region has a square shape, each side of the second region having a length equal to the thickness of the ceramic layer,
wherein a difference between a porosity of the first region and a porosity of the second region is not greater than 15%,
wherein the ceramic layer is an admixture of glass powder containing a glass ingredient that has been molten once,
wherein the glass powder admixed with the ceramic material of the ceramic layer contains silicon oxide by 20 to 80 mol %, boron oxide by 1 to 40 mol % and one or more than one alkali earth metal oxides by 1 to 40 mol %, and
wherein the glass powder is added to ceramic powder of the ceramic layer by not less than 0.5 wt % and not more than 10 wt % of weight of the ceramic powder.

11. A vibrating body comprising:
a substrate;
a piezoelectric element comprising a piezoelectric layer and electrode layers and joined to the substrate; and
a ceramic layer between the substrate and the piezoelectric element,
wherein a porosity of the entire ceramic layer is higher than a porosity of the entire piezoelectric layer, and
wherein the porosity of the entire ceramic layer is between 10 and 60%.

12. The vibrating body according to claim 11,
wherein the ceramic layer comprises a first region and a second region which is adjacent to the first region in a direction perpendicular to a thickness direction of the ceramic layer,
wherein the first region has a square shape, each side of the first region having a length equal to a thickness of the ceramic layer,
wherein the second region has a square shape, each side of the second region having a length equal to the length of the side first region, and
wherein a difference between a porosity of the first region and a porosity of the second region is not greater than 15%.

13. A vibration type drive device comprising:
a vibrating body according to claim 11 as a drive power source.

14. The vibrating body according to 11,
wherein said substrate is made of a ceramic, and
wherein said ceramic layer contains glass material.

15. A vibration type drive device comprising:
the vibrating body according to claim 14 further comprising a plate having projections arranged on the vibrating body; and
a driven body which is driven by the vibrating body through the projections.

\* \* \* \* \*